United States Patent
Xiang et al.

(10) Patent No.: US 6,342,414 B1
(45) Date of Patent: Jan. 29, 2002

(54) DAMASCENE NISI METAL GATE HIGH-K TRANSISTOR

(75) Inventors: Qi Xiang, San Jose, CA (US); Paul R. Besser, Austin, TX (US); Matthew S. Buynoski, Palo Alto, CA (US); John C. Foster; Paul L. King, both of Mountain View, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/734,189

(22) Filed: Dec. 12, 2000

(51) Int. Cl.[7] .......................................... H01L 21/8238
(52) U.S. Cl. ..................................................... 438/201
(58) Field of Search .................................. 438/201, 296, 438/424, 430, 592, 595

(56) References Cited

U.S. PATENT DOCUMENTS

| | | | |
|---|---|---|---|
| 5,937,315 A | * 8/1999 | Xiang et al. | 438/486 |
| 5,960,270 A | * 9/1999 | Misra et al. | 438/197 |
| 6,054,355 A | * 4/2000 | Inumiya et al. | 438/296 |
| 6,245,618 B1 | * 6/2001 | An et al. | 438/289 |

* cited by examiner

Primary Examiner—David Nelms
Assistant Examiner—Quoc Hoang

(57) ABSTRACT

A method for implementing a self-aligned low temperature metal silicide gate is achieved by confining a low temperature silicidation metal within a recess overlying a channel and annealing to cause the low temperature silicidation metal and its overlying silicon to interact to form the self-aligned low temperature metal silicide gate. A planarization step is performed to remove the remaining unreacted silicon by chemical mechanical polishing until no silicon is detected.

18 Claims, 5 Drawing Sheets

DAMASCENE NISI METAL GATE HIGH-K TRANSISTOR

RELATED APPLICATIONS

The present invention contains subject matter similar to that disclosed in U.S. Application Ser. Nos. 09/691,181, filed Oct. 19, 2000; 09/731,031, filed Dec. 7, 2000; 09/734,186, filed Dec. 12, 2000, and 09/694,668, filed Oct. 26, 2000.

FIELD OF THE INVENTION

The present invention relates to semiconductor manufacturing technology, more particularly to a method for fabricating field effect transistors by a low temperature silicide process.

BACKGROUND OF THE INVENTION

Over the last few decades, the electronics industry has undergone a revolution by various efforts to decrease the size of device elements formed in integrated circuits (IC), and such efforts have contributed in increasing the density of circuit elements and device performance. A large variety of semiconductor devices have been manufactured having various applications in numerous disciplines.

Currently, the most common and important semiconductor technology presently used is silicon-based, and the most preferred silicon-based semiconductor device is a MOS (Metal Oxide Semiconductor) transistor. The principal elements of a typical MOS transistor generally comprise a semiconductor substrate on which a gate electrode is disposed. The gate electrode is typically a heavily doped conductor to which an input signal is typically applied via a gate terminal. Heavily doped active regions, e.g., source/drain regions, are formed in the semiconductor substrate and are connected to source/drain terminals. A channel region is formed in the semiconductor substrate beneath the gate electrode and separates the source/drain regions. The gate electrode is generally separated from the semiconductor substrate by a dielectric layer, e.g., an oxide layer, to prevent current from flowing between the gate electrode and the source/drain regions or channel regions.

Conventional process steps for fabricating a typical MOS transistor are depicted in FIGS. 1 to 8. First, as depicted in FIG. 1, an oxide layer is thermally grown on a semiconductor substrate 10, i.e., typically silicon, and a conductive layer, typically polysilicon, is formed over the oxide layer. The oxide layer and conductive layer are patterned and etched to form gate dielectric 12 and gate electrode 14, respectively. Then, as depicted in FIG. 2, impurity atoms, e.g., boron or phosphorus, are ion implanted into the surface of the silicon substrate 10, by utilizing the gate electrode 14 as a mask, to form shallow source/drain regions 16 on the main surface of the silicon substrate 10.

The ion implantation step is followed by an annealing step which normally involves a high temperature of 700° C. or higher to activate the implanted impurity atoms in the shallow source/drain regions 16 and to cure the damage caused by the physical impact to the crystal structure of the silicon substrate 10 when the impurity atoms are implanted thereto. Sidewall spacers 18 are then formed on the side surfaces of the gate dielectric 12 and gate electrode 14, as depicted in FIG. 3.

Subsequently, source/drain regions 20 are formed by ion implanting impurity atoms, e.g., boron or phosphorus, at the impurity implantation concentration and energy higher than those from the first annealing process, by utilizing the gate electrode 14 and the sidewall spacers 18 as a mask, as depicted in FIG. 4. Once again, the annealing process is performed at a high temperature of 700° C. or higher to activate the implanted impurity atoms in the source/drain regions 20 and to cure the damage caused by the implantation impact.

As transistor dimensions approached one micron in diameter, conventional parameters resulted in intolerably increased resistance between the active region 20 and conductive interconnect lines formed subsequently to interconnect various device elements in the integrated circuit device. The principle way of reducing such contact resistance is by forming a metal silicide atop the source/drain regions 20 and the gate electrodes 14 prior to application of the conductive film for formation of the various conductive interconnect lines. The most common metal silicide materials are $CoSi_2$ and $TiSi_2$.

As depicted in FIG. 5, a metal layer 22 is typically provided by first applying a thin layer of, for example, titanium, atop the wafer which contacts the source/drain regions 20. Then, the wafer is subjected to one or more annealing steps at the temperature of 800° C. or higher. This causes the titanium layer 22 to selectively react with the silicon of the source/drain regions 20 and the gate electrodes 14, thereby forming a metal silicide ($TiSi_2$) layer 24 selectively on the source/drain regions and the gate electrodes 14. Such a process is referred to as a salicide (self-aligned silicide) process because the $TiSi_2$ layer 24 is formed only where the titanium material directly contacts the silicon source/drain regions 20 and the polycrystalline silicon gate electrode 14. Following the formation of the silicide layer 24, as depicted in FIG. 7, an interlayer dielectric film 26 is deposited over the entire surface of the substrate 10, and an interconnect process is performed (not shown) to provide conductive paths by forming via holes through the interlayer dielectric 26 and filling the via holes with a conductive material, e.g., tungsten.

As the dimensions of the MOS transistor are further scaled down to submicron and nanometer dimensions, the thickness of the gate oxide is also scaled down accordingly. However, such excessively reduced thickness of the gate oxide causes charge carrier leakage by tunneling effect, thereby leading to faster degradation of the MOS transistor.

To solve this problem, a high k (dielectric constant) gate dielectric, e.g., $ZrO_2$, $HfO_2$, $InO_2$, $LaO_2$, $TaO_2$, was introduced to replace the silicon oxide for submicron MOS devices. However, it has been also observed that the high k gate dielectric becomes thermally unstable during the high temperature process steps for fabrication of the MOS transistor. For example, as mentioned above, the source/drain region activation annealing steps in FIGS. 2 and 4 and the silicidation step in FIG. 6 are normally performed at a temperature of at least 700° C. or higher, or in some cases at a temperature of 1000 ° C. or higher. At such a high temperature, tantalum oxide ($Ta_2O_5$), another high k gate dielectric, is transformed from amorphous to crystalline, which causes charge carrier leakage. In addition, at such a high temperature, tantalum oxide undesirably interacts with the underlying silicon substrate or overlying polysilicon gate electrode of the MOS transistor.

To solve this problem, a metal gate electrode has been introduced to avoid the reaction between the high k gate dielectric and the polysilicon gate electrode during the high temperature processing steps. For example, as described in the U.S. Pat. No. 5,960,270 by Misra, et al. a metal deposition process was proposed to form a metal gate layer by depositing molybdenum, tungsten, tungsten silicide, nickel silicide, or titanium nitride. However, it has been also observed that the metal atoms from the gate electrode diffuse into the gate dielectric, thereby causing faster degradation of the high k gate dielectric, and both the high k gate dielectric and the metal gate electrode suffer structural stress from such high temperature process steps. Also, since the metal or metal silicide layer is deposited entirely over the semiconductor structure, it has been observed that it is difficult to controllably remove the unnecessary portions of the deposited metal or metal silicide layer to shape a metal or metal silicide gate due to the material unity.

Thus, there is a continuing need for improved methods that enable implementation of a reliable gate structure in submicron MOS transistors without the undesirable side effects and complicated process steps.

SUMMARY OF THE INVENTION

These and other needs are met by the present invention that provides a method for forming a self-aligned low temperature metal silicide gate on a high k gate dielectric layer within semiconductor structures. The method includes forming a precursor having a substrate with active regions separated by a channel, and a temporary gate over the channel and between dielectric structures. The temporary gate is removed to form a recess having a bottom and sidewalls between the dielectric structures, and a high dielectric constant (high K) gate dielectric layer is deposited in the recess on the bottom and sidewalls. A low temperature silicidation metal is deposited over the semiconductor structure including the recess, and the low temperature silicidation metal is removed from the semiconductor structure except for a portion in the recess. Silicon is deposited over the semiconductor structure, and annealing is performed to cause the silicon and the portion of the low temperature silicidation metal in the recess to interact to form a self-aligned low temperature metal silicide gate. The semiconductor structure is then planarized to remove the amorphous silicon.

Hence, in accordance with an aspect of the present invention, the low temperature silicide metal deposited over the semiconductor structure is removed except for a portion in the recess, which enables the portion in the recess to selectively interact with the overlying silicon, thereby forming the self-aligned low temperature silicide gate selectively within the recess. Since the silicidation between the silicon and the low temperature silicidation metal occurs selectively in the recess, and other portions of the silicon remain unchanged, the remaining portions of the low temperature silicidation metal can be easily removed, by planarization, for example. Also, since the metal silicide gate is formed at the low temperature, e.g., approximately 700° C., the high k gate dielectric is prevented from interacting with the underlying semiconductor substrate and the overlying gate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The method and apparatus described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

The present invention provides a method for implementing a self-aligned low temperature metal silicide gate on a high k gate dielectric without the problems accompanied in conventional methods. This is achieved by using dummy gate techniques to confine a low temperature silicidation metal within a recess formed over a channel and annealing to cause the low temperature silicidation metal and its overlying silicon to react to form the self-aligned low temperature metal silicide gate. Since the removal of the low temperature silicidation metal except for the portion in the recess is performed prior to the low temperature silicidation, the remaining unreacted portions of the silicon can be easily removed, for example, by planarization, e.g., chemical mechanical polishing. Also, since the metal silicide gate is formed at the low temperature, e.g., approximately 700° C., the high k gate dielectric is prevented from interacting with the underlying semiconductor substrate and the overlying gate.

Figure 8:
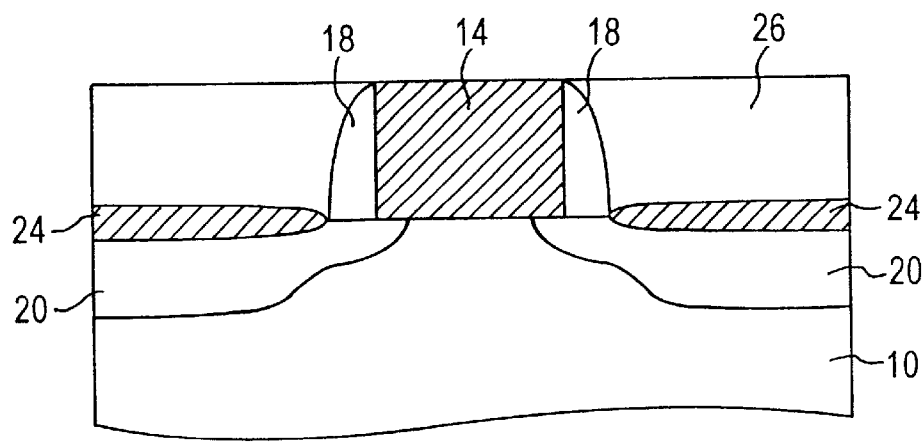
FIG. 8 is a schematic depiction of a cross-section of a semiconductor structure precursor in accordance with embodiments of the present invention.

With this in mind, FIG. 8 is a cross-section of a precursor for the semiconductor structure constructed in accordance with embodiments of the present invention. In FIG. 8, a silicon substrate 10 has active regions 20 formed therein by conventional ion implantation and subsequent annealing techniques. A silicide layer 24 is formed atop the active regions 20 to reduce the resistance between the active regions and conductive interconnect lines which will be formed subsequently.

A polysilicon gate 14, which serves as a temporary gate, is provided on top of the channel. Sidewall spacers 18 are provided on the side walls of the gate 14, and interlayer dielectric 26 is provided to cover the active regions 20 and the silicide layer 24. Although it is not shown, a silicon oxide gate dielectric could be formed between the substrate 10 and the gate 14.

Figure 9:
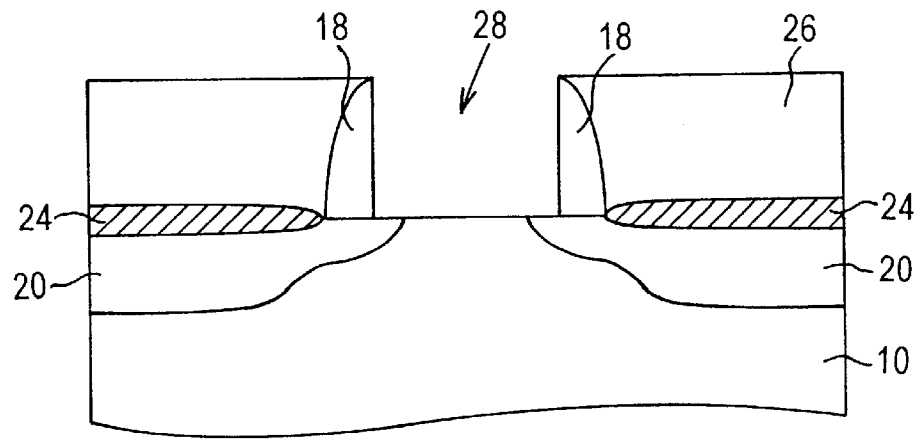
FIG. 9 depicts the portion of FIG. 8, after the temporary gate electrode has been removed to form a recess.

As previously mentioned, the annealing and silicidation steps which involve high temperatures, e.g., approximately 700° C. or higher, are completed before the temporary gate 14 is removed from the region between the sidewall spacers 18, as depicted in FIG. 9. A plasma reactive ion etch (RIE) using chlorine or a wet polysilicon etch using conventional etch chemistry may be utilized to remove the polysilicon gate 14 to form an opening (i.e., recess) 28.

Figure 10:
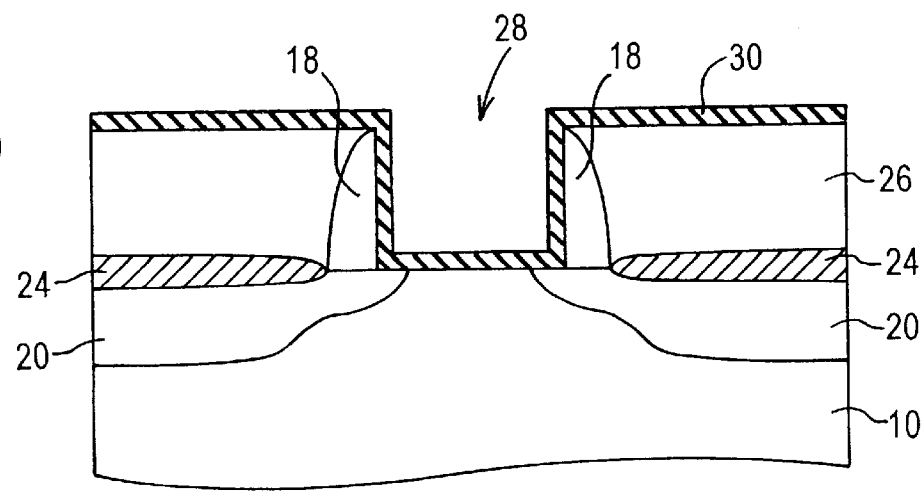
FIG. 10 depicts the portion of FIG. 9, after a high k dielectric layer has been deposited on the surfaces of the recess and over the interlayer dielectric layer.

In FIG. 10, a high k dielectric is provided as layer 30 having a thickness between about 50 Å and about 200Å, for example. Conventional methods of deposition, such as chemical vapor deposition, may be used to deposit the high k gate dielectric layer 30. Typical materials that may be used in the high k gate dielectric layer 30 include $ZrO_2$, $HfO_2$, $InO_2$, $LaO_2$, $TaO_2$, for example. Other multiple metal oxides may be used or perovskites may be employed as the high k gate dielectric material in layer 26.

As previously mentioned, a reason for using high k materials as a gate dielectric is that conventional silicon dioxide is no longer extendable. Also, a high k gate dielectric provides better electrical coupling with the gate and the channel. Also, with high k materials, a thicker film can be used while still obtaining the same electrical field. One of the concerns with high k materials, however, is its low temperature stability. In other words, at high temperatures, high k material reacts with the silicon substrate. Processing at lower temperatures, such as with nickel silicide, mitigate this concern.

Figure 1:
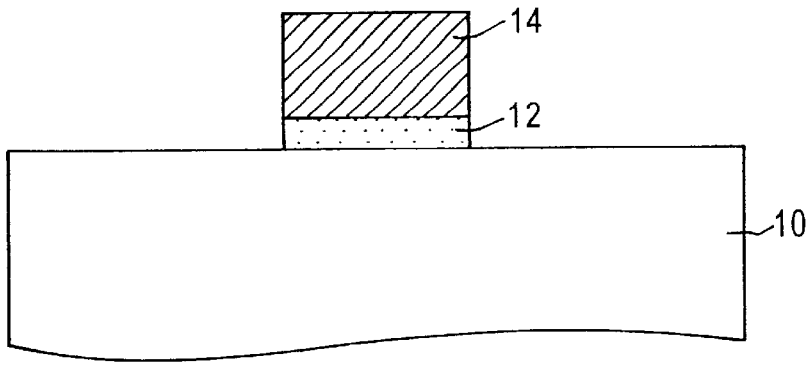
FIG. 1 is a schematic depiction of a cross-section of a prior art semiconductor structure, in which a gate electrode is formed on a semiconductor substrate with a gate oxide therebetween.
Figure 2:
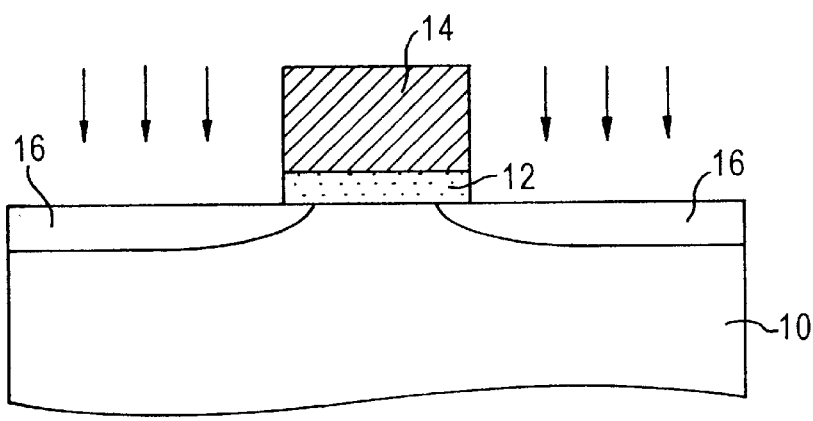
FIG. 2 depicts the portion of FIG. 1, during the first ion implantation process to form shallow source and drain regions on the main surface of the substrate.
Figure 3:
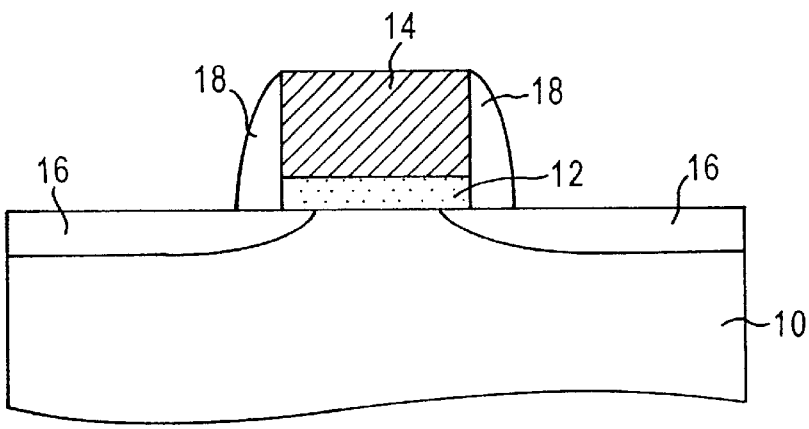
FIG. 3 depicts the portion of FIG. 2, after the first annealing process and a sidewall spacer formation process.
Figure 4:
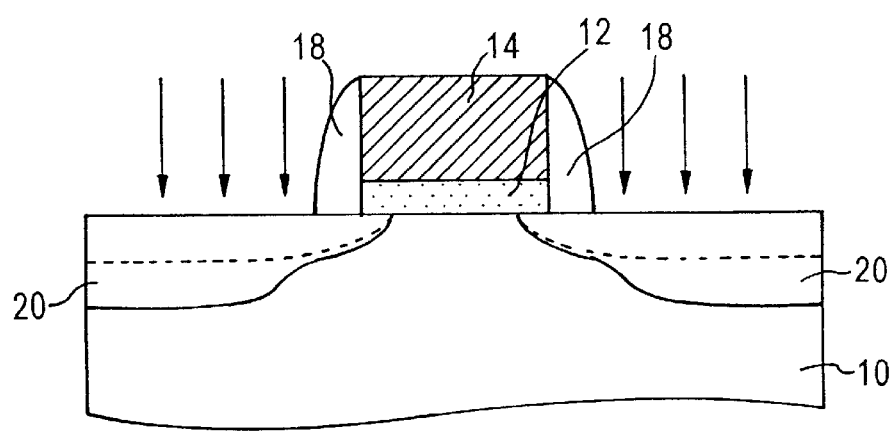
FIG. 4 depicts the portion of FIG. 3, during the second ion implantation process to form source and drain regions on the main surface of the substrate.
Figure 5:
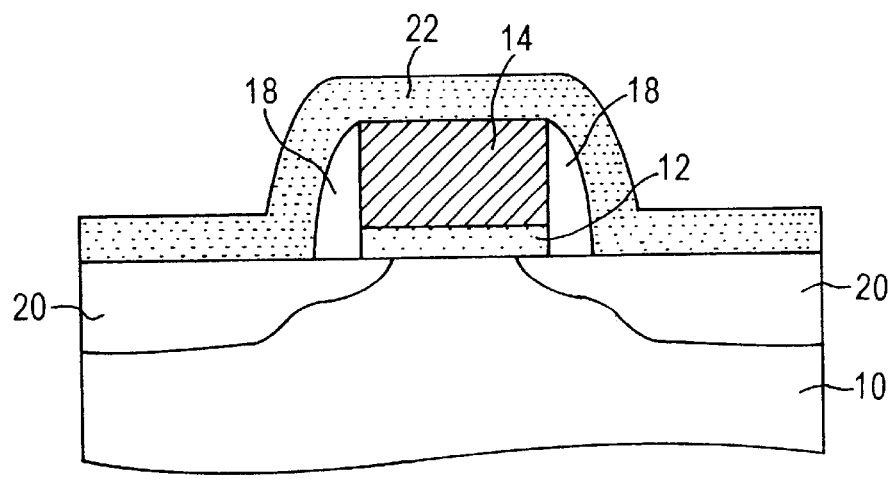
FIG. 5 depicts the portion of FIG. 4, after the second annealing process and a metal layer deposition process.
Figure 6:
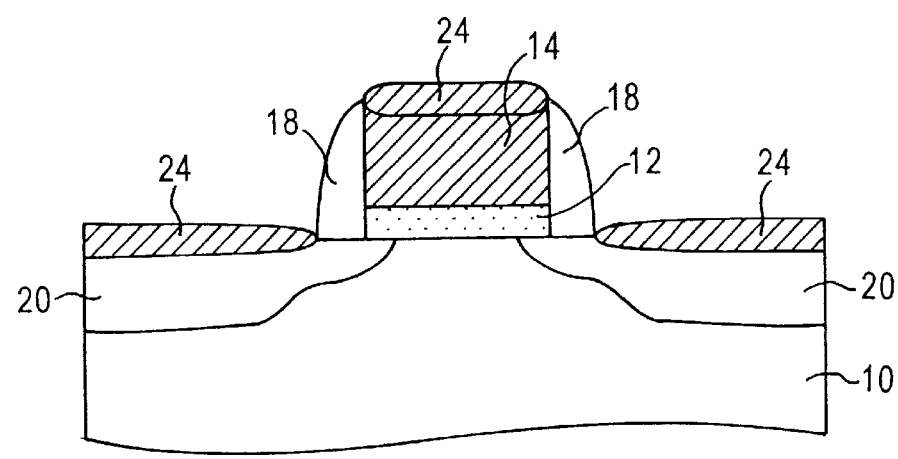
FIG. 6 depicts the portion of FIG. 5, after a silicidation process to form a metal silicide layer on the source and drain regions and the gate electrode.
Figure 7:
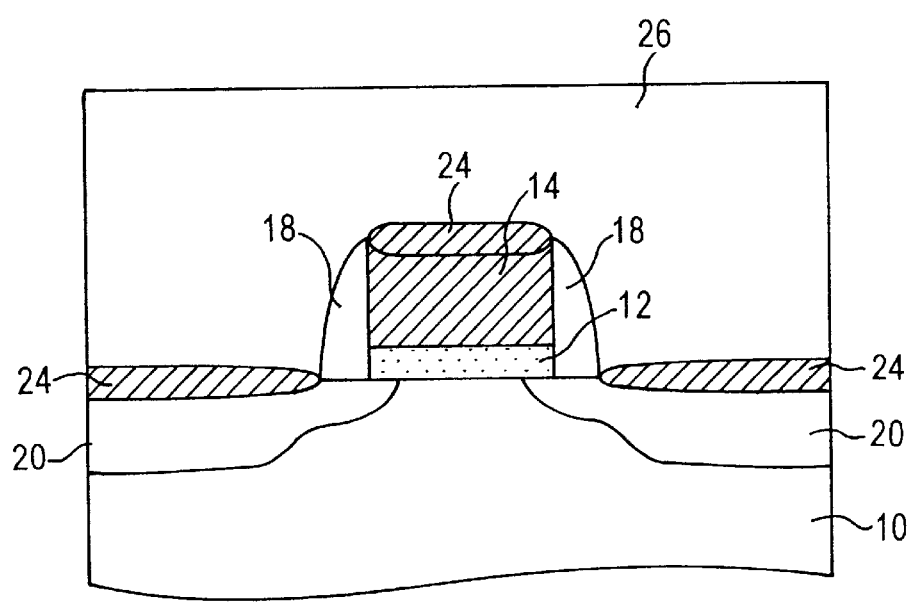
FIG. 7 depicts the portion of FIG. 6, after an interlayer dielectric layer is formed over the semiconductor structure.
Figure 11:
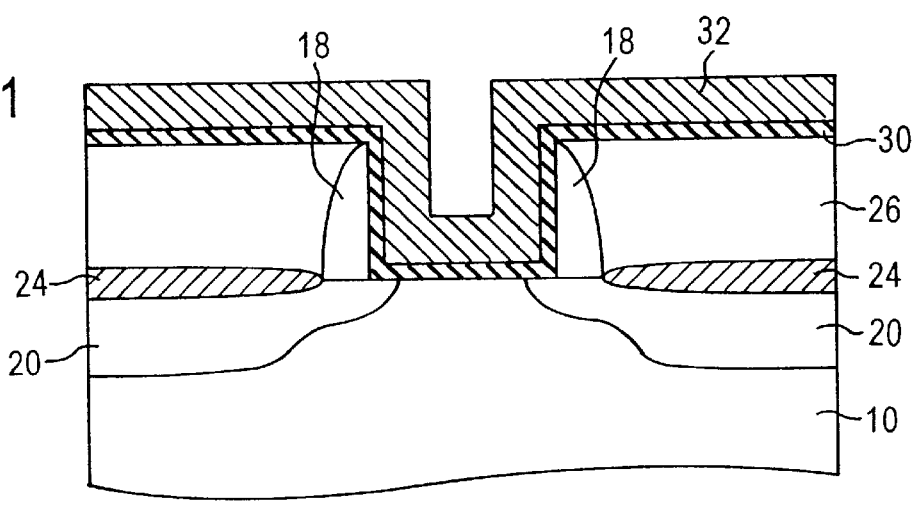
FIG. 11 depicts the portion of FIG. 10, after a low temperature silicidation metal has been deposited over the high K dielectric layer.

FIG. 11 depicts the semiconductor structure of FIG. 3, after deposition of a low temperature silicidation metal (e.g., nickel) 32. The low temperature silicidation metal 32 is provided within the recess 28 on top of the high k gate dielectric layer 30. The deposition may be performed by low temperature chemical vapor deposition (CVD) or plasma enhanced chemical vapor deposition (PECVD).

Figure 12:
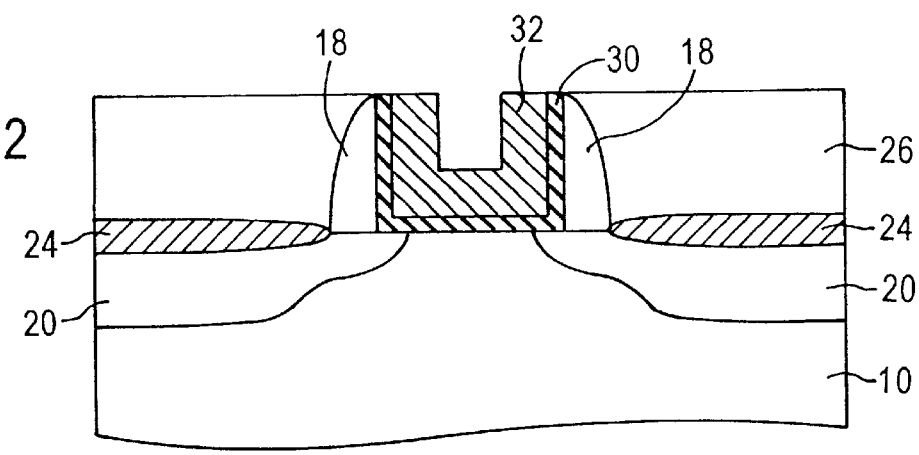
FIG. 12 depicts the portion of FIG. 11, after the low temperature silicidation metal has been removed except for the portion in the recess

Following the deposition of the low temperature silicidation metal 32, as depicted in FIG. 12, the semiconductor structure of FIG. 11 is planarized, by chemical mechanical planarization (CMP), for example, to remove the low temperature silicidation metal 32 and the high k gate dielectric 30 except for the portion within the recess 28. As will be described hereafter, by confining the low temperature silicidation metal 32 within the recess 28, a self-aligned silicidation is achieved.

Figure 13:
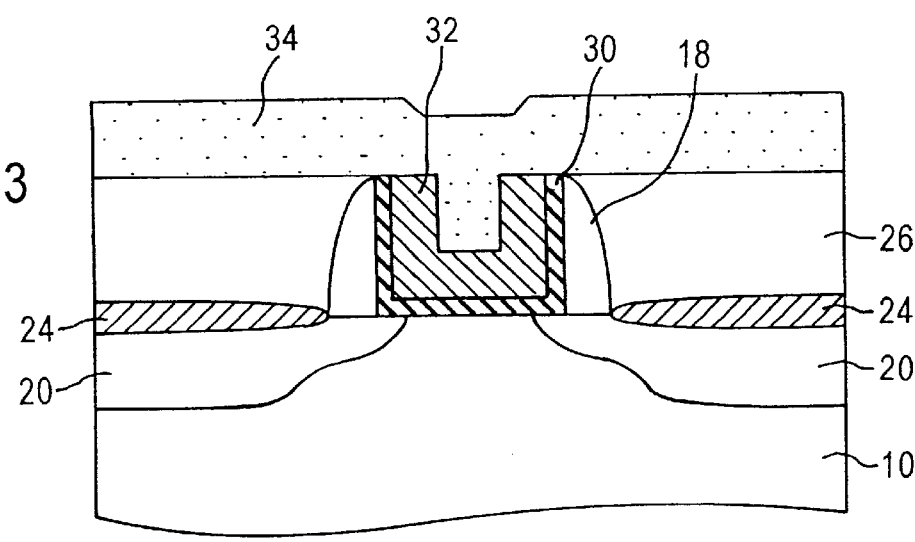
FIG. 13 depicts the portion of FIG. 12, after silicon has been deposited over the entire semiconductor structure.

In FIG. 13, silicon (e.g., amorphous silicon or polysilicon) 34 is deposited entirely over the semiconductor structure by conventional deposition techniques. The deposition may be performed by low temperature chemical vapor deposition (CVD) at a temperature sufficient to prevent the high k gate dielectric 30 from becoming unstable, for example, at a temperature between about 500° C. and about 600° C.

Figure 14:
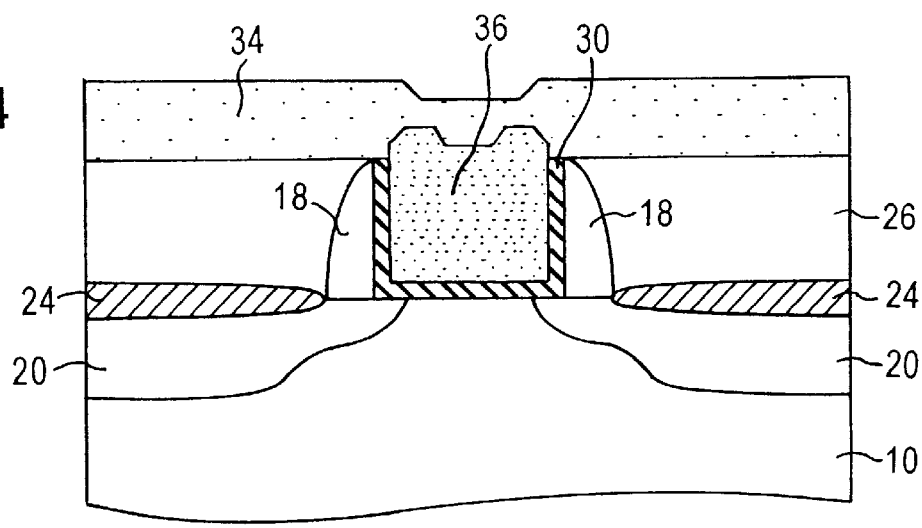
FIG. 14 depicts the portion of FIG. 13, after annealing to form a self-aligned low temperature silicide gate over the channel.

Subsequently, in FIG. 14, annealing is performed to convert the low temperature silicidation metal 32 confined in the recess 28 to self-aligned silicide 36. Since the silicon 34 is in limited contact with the low temperature silicidation metal 32 over the recess 28, the self-aligned silicide metal gate (e.g., nickel silicide) 36 is selectively formed over the high k gate dielectric 30. Other portions of the silicon 34, which were not in contact with the low temperature silicidation metal 32, remain unchanged. To maintain the high k gate dielectric 30 stable, rapid thermal annealing is performed to form the self-aligned silicide metal gate (e.g., nickel silicide) 36, at a temperature between about 500° C. and about 600° C. for a period of between about 30 seconds and about 60 seconds.

Figure 15:
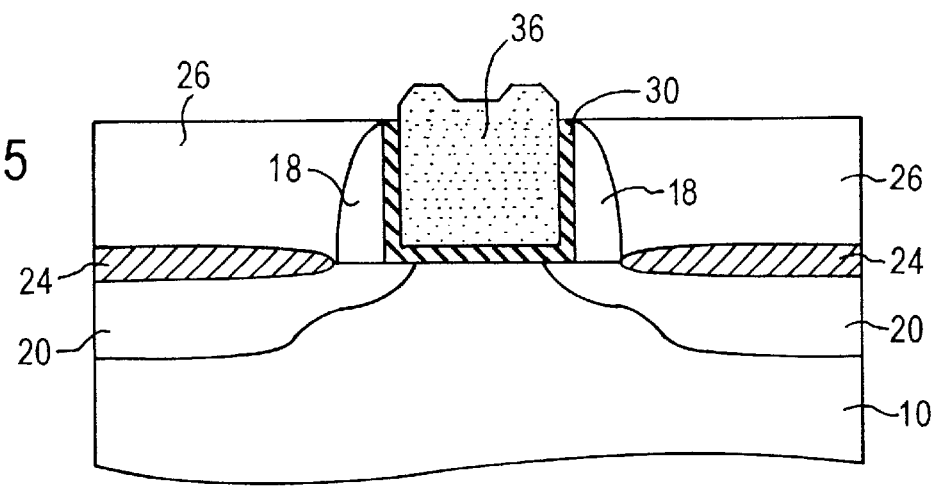
FIG. 15 depicts the portion of FIG. 13, after the semiconductor structure is planarized to remove the low temperature silicidation metal.

In FIG. 15, the remaining unreacted portion of the silicon 34 is removed by conventional planarization techniques, e.g., chemical mechanical polishing (CMP) by utilizing the material difference between the metal silicide gate (e.g., nickel silicide gate) 36 and the silicon layer 34. Since the silicide metal gate 36 is selectively formed over the high k gate dielectric 30, not entirely deposited over the entire upper surface of the semiconductor structure including the recess, the planarization step can preformed with less complexity, by chemical mechanical polishing, until no silicon is detected, thereby automatically shaping the siuicide metal gate 36.

Thus, the present invention enables implementation of a self-aligned low temperature metal silicide gate over a high k dielectric film, by manipulating the material difference between a metal silicide gate and silicon overlying the metal silicide gate. In accordance with the present invention, the lower temperature silicidation occurs at the necessary areas, thereby avoiding silicidation of the entire upper surface of the semiconductor structure. This enables easier formation of the low temperature metal silicide gate, simply by planarizing the unreacted silicon, until no silicon is detected. Also, since the metal silicide gate is formed at the low temperature, e.g., approximately 700° C., the high k gate dielectric is prevented from interacting with the underlying semiconductor substrate and the overlying gate.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a semiconductor structure comprising the steps of:

forming a precursor having a substrate with active regions separated by a channel, and a temporary gate over the channel and between dielectric structures;

removing the temporary gate to form a recess with a bottom and sidewalls between the dielectric structures;

depositing a high dielectric constant (high K) gate dielectric layer in the recess on the bottom and sidewalls;

depositing a low temperature silicidation metal over the semiconductor structure including the recess;

removing the low temperature silicidation metal except for a portion in the recess;

depositing silicon over the semiconductor structure;

annealing to cause the silicon and the portion of the low temperature silicidation metal in the recess to interact to form a self-aligned low temperature metal silicide gate; and planarizing the semiconductor structure to remove the silicon.

2. The method of claim 1, wherein a thickness of the high K gate dielectric layer is between approximately 50 Å and approximately 200 Å.

3. The method of claim 1, wherein the low temperature silicidation metal is deposited by a chemical vapor deposition (CVD).

4. The method of claim 3, wherein the chemical vapor deposition is a plasma enhanced chemical vapor deposition (PECVD).

5. The method of claim 3, wherein the low temperature silicidation metal is nickel.

6. The method of claim 1, wherein the low temperature silicidation metal is removed by a chemical mechanical polishing (CMP).

7. The method of claim 1, wherein the silicon is amorphous silicon or polysilicon.

8. The method of claim 1, wherein the silicon is deposited by lower temperature chemical vapor deposition (CVD) at a temperature between approximately 500° C. and approximately 600° C.

9. The method of claim 1, wherein the annealing is performed by a rapid thermal annealing at a temperature between approximately 400° C. and approximately 600° C. for a period of between approximately 30 seconds and approximately 60 seconds.

10. The method of claim 1, wherein the semiconductor structure is planarized by a chemical mechanical polishing (CMP).

11. The method of claim 1, wherein further processing of the semiconductor structure is maintained below a temperature sufficient to prevent a substantial interaction between the high k gate dielectric layer and the substrate.

12. The method of claim 11, the temperature is approximately 700° C.

13. The method of claim 1, wherein the dielectric structures are an interlayer dielectric.

14. A method of implementing a high k gate dielectric layer in a semiconductor structure comprising the steps of:

forming active regions with a channel therebetween on a main surface of a semiconductor substrate;

forming high temperature silicide on the active regions;

forming a temporary gate over the channel between dielectric structures;

removing the temporary gate to form a recess with a bottom and sidewalls between the dielectric structures;

depositing a high dielectric constant (high k) gate dielectric in the recess;

depositing a low temperature silicidation metal over the semiconductor structure;

removing the low temperature silicidation metal except for a portion in the recess;

depositing silicon over the semiconductor structure;

annealing to cause the silicon and the portion of the low temperature silicidation metal to interact to form a self-aligned low temperature silicide gate; and planarizing the semiconductor structure to remove the silicon remaining unreacted after the annealing.

15. The method of claim 14, wherein the active regions are formed by ion implanting an impurity and annealing performed at a temperature higher than approximately 700° C.

16. The method of claim 14, wherein the high temperature silicide is formed at a processing temperature higher than approximately 700° C.

17. The method of claim 14, wherein the low temperature silicidation metal is nickel.

18. The method of claim 14, wherein the annealing is performed at a temperature lower than approximately 700° C.

* * * * *